(12) United States Patent
Kwon et al.

(10) Patent No.: US 12,721,026 B2
(45) Date of Patent: Aug. 25, 2026

(54) METHOD OF MANUFACTURING DISPLAY DEVICE FOR CONTROLLING PEEL STRENGTH OF RESIN LAYER

(71) Applicant: Samsung Display Co., LTD., Yongin-si (KR)

(72) Inventors: Seungwook Kwon, Yongin-si (KR); Heechang Yoon, Yongin-si (KR); Jinho Hyun, Yongin-si (KR); Ohjune Kwon, Yongin-si (KR); Hyojeong Kwon, Yongin-si (KR); Seunggun Chae, Yongin-si (KR); Seung-Yeon Chae, Yongin-si (KR); Sangyeon Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 460 days.

(21) Appl. No.: 18/217,538

(22) Filed: Jul. 1, 2023

(65) Prior Publication Data

US 2024/0099117 A1 Mar. 21, 2024

(30) Foreign Application Priority Data

Sep. 20, 2022 (KR) ........................ 10-2022-0118383

(51) Int. Cl.
*H10K 71/40* (2023.01)
*H10K 59/12* (2023.01)
*H10K 59/80* (2023.01)

(52) U.S. Cl.
CPC ......... *H10K 71/40* (2023.02); *H10K 59/1201* (2023.02); *H10K 59/873* (2023.02)

(58) Field of Classification Search
CPC .. H10K 71/40; H10K 59/1201; H10K 59/873; H10K 50/84; H10K 71/00; H01L 51/5253; H01L 51/56; H01L 2251/303; H01L 27/3258; H01L 51/5256; H01L 2251/301; H01L 2251/558
See application file for complete search history.

(56) References Cited

U.S. PATENT DOCUMENTS 4,358,476 A * 11/1982 Zimmer ............... C09D 11/101 522/86
10,135,026 B2 * 11/2018 Moon .................. H10K 59/131
10,637,006 B2 * 4/2020 Ye ........................... G06F 3/044
(Continued)

FOREIGN PATENT DOCUMENTS

CN 111995947 B 4/2022
KR 100552388 B1 2/2006
(Continued)

OTHER PUBLICATIONS

Office Action dated Jun. 1, 2026 from the Korean Intellectual Property Office (KIPO) for Korean Patent Application No. 10-2022-0118383, 12 pages.

*Primary Examiner* — Caleb E Henry
(74) *Attorney, Agent, or Firm* — CANTOR COLBURN LLP

(57) ABSTRACT

A method of manufacturing a display device includes providing an encapsulation layer on a display panel, providing an uncured resin layer on the encapsulation layer and forming a protective layer by curing the uncured resin layer in a nitrogen atmosphere having an oxygen concentration in a range of about 300 ppm to about 10000 ppm.

18 Claims, 9 Drawing Sheets

(56) References Cited

U.S. PATENT DOCUMENTS 10,800,936 B2 10/2020 Landa et al.
10,833,139 B2* 11/2020 Kim .................... H10K 59/124
2007/0043166 A1* 2/2007 Hoshika ................ H01L 23/293 524/763
2008/0151952 A1* 6/2008 Takatani ............... H01S 5/2231 257/E31.118
2008/0238303 A1* 10/2008 Lee ...................... H10K 59/874 445/24
2008/0303432 A1* 12/2008 Shao .................... H10K 85/141 313/504
2009/0036623 A1* 2/2009 Tsuda ................... H10K 85/151 526/242
2010/0249406 A1* 9/2010 Yamakawa .......... C07D 251/24 544/216
2011/0132449 A1* 6/2011 Ramadas ............. H10K 59/871 428/419
2011/0190494 A1* 8/2011 Aihara ................... C09K 11/06 257/E51.024
2011/0288295 A1* 11/2011 Aihara ................... H10K 50/16 544/180
2012/0098421 A1* 4/2012 Thompson .............. B32B 27/08 428/315.9
2012/0112177 A1* 5/2012 Ishikawa ................ H05B 33/14 564/429
2012/0214993 A1* 8/2012 Aihara ................... H05B 33/10 544/333
2013/0035491 A1* 2/2013 Tanaka ................. H10K 85/654 546/255
2013/0197293 A1* 8/2013 Assenov ................. G21F 9/162 588/14
2013/0199603 A1* 8/2013 Snaith .................. H01G 9/2009 257/40
2013/0303649 A1* 11/2013 Ichiryu ............... C08F 293/005 524/99
2013/0320392 A1* 12/2013 Koshikawa ............. C08L 71/02 528/30
2014/0179040 A1* 6/2014 Ramadas ........... H10K 50/8445 118/50.1
2014/0330013 A1* 11/2014 Aihara ................ C07D 401/14 544/180
2015/0034916 A1 2/2015 Lee et al.
2015/0179976 A1* 6/2015 Galand ................ H10K 85/151 522/39
2016/0033841 A1* 2/2016 Gauthier .............. B23K 26/402 219/121.72
2017/0110421 A1* 4/2017 Liu ......................... H01L 24/20
2019/0091976 A1* 3/2019 Roehrig .................. B32B 27/30
2019/0169470 A1* 6/2019 Dollase ...................... C09J 5/06
2019/0256655 A1* 8/2019 Masuda .................. H01L 23/29
2020/0152907 A1* 5/2020 Oh ..................... H10K 59/8722
2021/0028394 A1* 1/2021 Woo ....................... H10K 71/40
2021/0116810 A1* 4/2021 Hashimoto .......... C08G 73/106
2021/0376301 A1* 12/2021 Kim ................... H10K 59/8731
2022/0093898 A1* 3/2022 Kim ....................... H10K 59/87
2022/0388309 A1* 12/2022 Shimoda ................ B41J 2/1642
2023/0141999 A1* 5/2023 Lee ...................... H10K 59/131 257/91
2023/0259171 A1* 8/2023 Kim ...................... G06F 1/1616 361/679.01
2023/0307251 A1* 9/2023 Liu ......................... H01L 24/19
2023/0382097 A1* 11/2023 Oh .................... G02F 1/133331

FOREIGN PATENT DOCUMENTS

KR 20150014775 A 2/2015
KR 20200049385 A 5/2020

* cited by examiner

METHOD OF MANUFACTURING DISPLAY DEVICE FOR CONTROLLING PEEL STRENGTH OF RESIN LAYER

This application claims priority to Korean Patent Application No. 10-2022-0118383, filed on Sep. 20, 2022, and all the benefits accruing therefrom under 35 U.S.C. § 119, the content of which in its entirety is herein incorporated by reference.

BACKGROUND

1. Field

Embodiments relate to a display device. More particularly, embodiments relate to a method of manufacturing the display device.

2. Description of the Related Art

The display device is a device that displays an image for providing visual information to a user. Among display devices, an organic light emitting diode display has recently attracted attention.

The organic light-emitting display device has a self-emission characteristic and does not include a separate light source, unlike a liquid crystal display device, so that the thickness and weight may be reduced. In addition, the organic light emitting diode display exhibits high quality characteristics such as low power consumption, high luminance, and high reaction speed.

SUMMARY

During a manufacturing process of a display device, a protective layer for protecting a display panel and an encapsulation layer is typically provided. The protective layer may be attached or formed on the display panel and the encapsulation layer. However, the protective layer may be peeled off and removed from the display panel and the encapsulation layer after the manufacturing process is finished.

Embodiments provide a method of manufacturing a display device capable of controlling a peel strength of a resin layer.

A method of manufacturing a display device according to an embodiment includes providing an encapsulation layer on a display panel, providing an uncured resin layer on the encapsulation layer and forming a protective layer by curing the uncured resin layer in a nitrogen atmosphere having an oxygen concentration in a range of about 300 parts per million (ppm) to about 10000 ppm.

In an embodiment, a polymer network may be formed when the uncured resin layer is cured.

In an embodiment, the protective layer may include the polymer network.

In an embodiment, the method may further include before the providing the uncured resin layer, performing a plasma treatment with ozone on a surface of the encapsulation layer.

In an embodiment, an oxygen concentration on the surface of the encapsulation layer may increase through the performing the plasma treatment with ozone.

In an embodiment, the protective layer may include a first surface exposed to an outside and a second surface contacting the surface of the encapsulation layer, and an end of the first surface and an end of the second surface may be connected to each other.

In an embodiment, a length between the first surface and the second surface may decrease as being toward the end of the first surface and the end of the second surface connected to each other.

In an embodiment, a density of the polymer network in the first surface of the protective layer may be different from a density of the polymer network in an inner portion of the protective layer.

In an embodiment, the density of the polymer network of the first surface of the protective layer may be less than the density of the polymer network in the inner portion of the protective layer.

In an embodiment, a density of the polymer network of the protective layer may increase as being away from the first surface of the protective layer toward an inner portion of the protective layer.

In an embodiment, a density of the polymer network of the second surface of the protective layer may be different from a density of the polymer network in an inner portion of the protective layer.

In an embodiment, the density of the polymer network of the second surface of the protective layer may be less than the density of the polymer network in the inner portion of the protective layer.

In an embodiment, the density of the polymer network of the protective layer may increase as being away from the second surface of the protective layer toward the inner portion of the protective layer.

In an embodiment, the first surface of the protective layer may have a hardness less than a hardness of an inner portion of the protective layer.

In an embodiment, the second surface of the protective layer may have a hardness less than a hardness of an inner portion of the protective layer.

In an embodiment, the providing the uncured resin layer may include using an inkjet method.

In an embodiment, the forming the protective layer may include irradiating the uncured resin layer with ultraviolet light.

In an embodiment, the method may further include peeling the protective layer from the encapsulation layer and the display panel.

In an embodiment, the protective layer may have a peel strength in a range of about 1 gram-force per inch (g·f/inch) to about 80 g·f/inch.

In an embodiment, the peel strength of the protective layer may be controlled by controlling the oxygen concentration of the nitrogen atmosphere.

In a method of manufacturing a display device according to embodiments of the disclosure, the density of the polymer network of the protective layer is adjusted through the oxygen concentration of an atmosphere, so that the peel strength of the protective layer may be controlled during the manufacturing process of the display device. In such embodiments, the peel strength of the protective layer may be adjusted by controlling the oxygen concentration based on a material of the member with which the protective layer contacts. Therefore, in a case where the protective layer is formed by an inkjet method, the protective layer may be easily peeled from the display panel and the encapsulation layer, so that the manufacturing efficiency of the display device may be increased.

DETAILED DESCRIPTION

Figure 1:
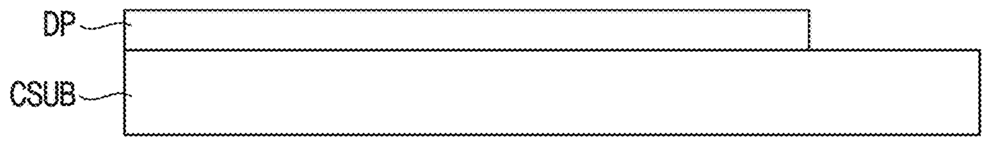
FIG. 1 is a cross-sectional view illustrating a process of a method of manufacturing a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described in detail with reference to the accompanying drawings. The same reference numerals are used for the same components in the drawings, and any repetitive detailed descriptions of the same components will be omitted or simplified.

FIGS. 1 to 12 are views for illustrating a method of manufacturing a display device according to an embodiment of the disclosure.

Figure 2:
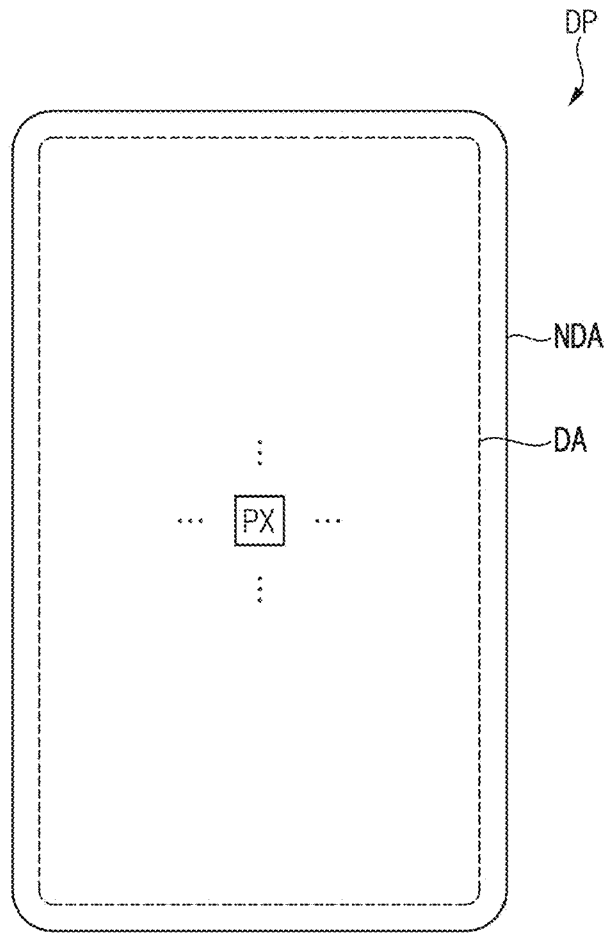
FIG. 2 is a plan view illustrating the display panel of FIG. 1.
Figure 3:
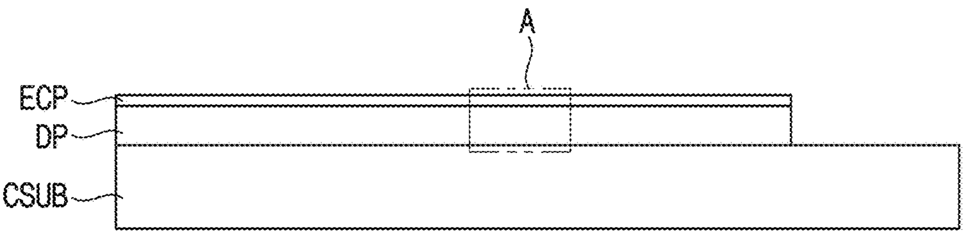
FIG. 3 is a cross-sectional view illustrating a process of a method of manufacturing a display device according to an embodiment of the disclosure.

Particularly, FIG. 1 is a cross-sectional view illustrating a process of a method of manufacturing a display device according an embodiment of to the disclosure, FIG. 2 is a plan view illustrating the display panel of FIG. 1, and FIG. 3 is a cross-sectional view illustrating a process of a method of manufacturing a display device according to an embodiment of the disclosure.

Referring to FIG. 1, in an embodiment of a method of manufacturing a display device, a carrier substrate CSUB may be prepared. The carrier substrate CSUB may include or be formed of a rigid material. In an embodiment, for example, the carrier substrate CSUB may be formed of glass. However, the disclosure is not limited thereto.

A display panel DP may be formed on the carrier substrate CSUB. The display panel DP may include a display area DA and a non-display area NDA. The display area DA may be an area for displaying an image. In an embodiment, as shown in FIG. 2, a planar shape of the display area DA may be a rectangular shape or a rectangular shape with rounded corners. However, the planar shape of the display area DA is not limited thereto, and the display area DA may have various planar shapes such as a circular shape, an elliptical shape, and a polygonal shape.

The non-display area NDA may be disposed around the display area DA. The non-display area NDA may surround the display area DA. The non-display area NDA may be an area on which no image is displayed. In an embodiment, drivers for displaying an image of the display area DA may be disposed in the non-display area NDA.

Pixels PX may be arranged in a matrix in the display area DA. Signal lines such as a gate line and a data line may be disposed in the display area DA. The signal lines such as the gate line and the data line may be connected to each of the pixels PX. Each of the pixels PX may receive a gate signal, a data signal, or the like from the signal line.

Further referring to FIG. 3, an encapsulation layer ECP may be provided or formed on the display panel DP. The encapsulation layer ECP may cover the display panel DP.

Figure 4:
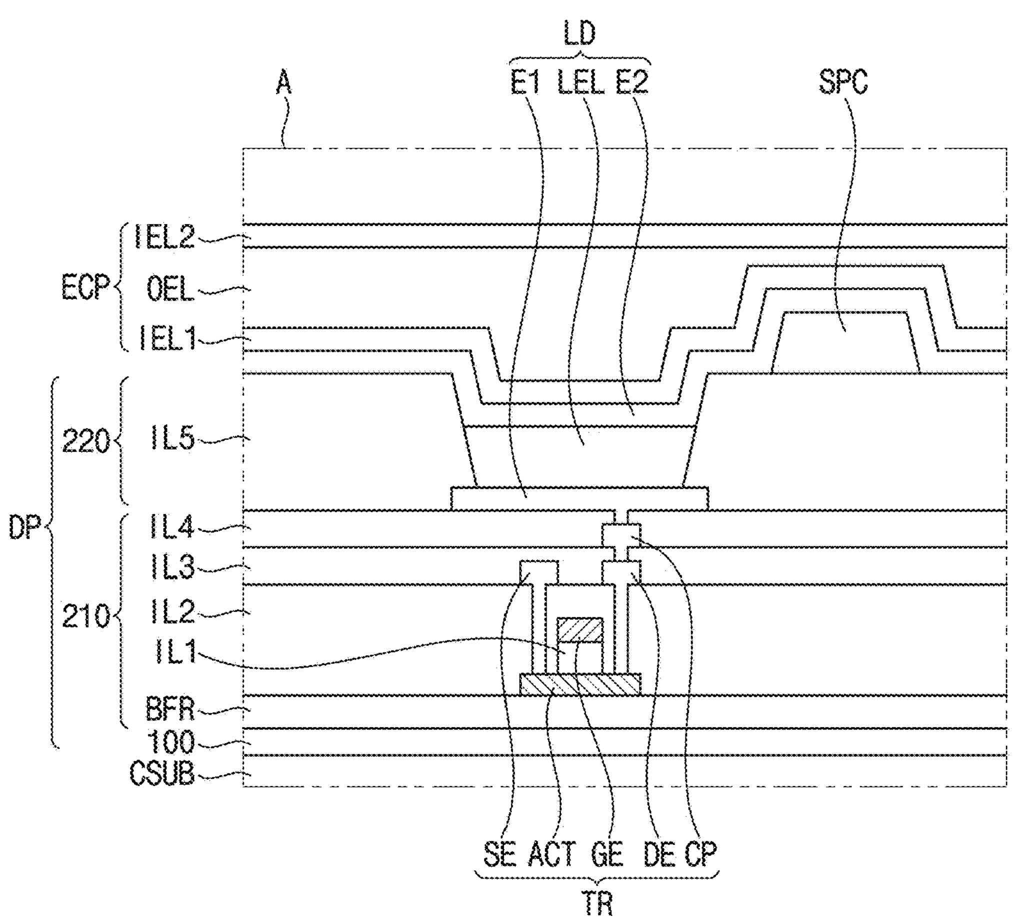
FIG. 4 is an enlarged cross-sectional view of area A of FIG. 3.

FIG. 4 is an enlarged cross-sectional view of area A of FIG. 3.

Referring further to FIG. 4, an embodiment of the display panel DP may include a substrate 100, a circuit element layer 210 and a light emitting element layer 220. The encapsulation layer ECP may be provided or formed on the display panel DP.

The substrate 100 may be formed on the carrier substrate CSUB. The substrate 100 may include or be formed of a transparent or opaque material. The substrate 100 may include glass, quartz, plastic, or the like.

The circuit element layer 210 may be disposed or formed on the substrate 100. The circuit element layer 210 may include insulation layers and conductive layers. The light emitting element layer 220 may be disposed or formed on the circuit element layer 210. The light emitting element layer 220 may include a fifth insulation layer IL5 and a light emitting diode LD. The light emitting element layer 220 may emit light, and the circuit element layer 210 may drive the light emitting element layer 220.

The circuit element layer 210 may include a buffer layer BFR, at least one transistor TR, a connection electrode CP, a first insulation layer ILL a second insulation layer IL2, and a third insulation layer IL3, and a fourth insulation layer IL4. The transistor TR may include an active layer ACT, a gate electrode GE, a source electrode SE, and a drain electrode DE.

The light emitting element layer 220 may include a fifth insulation layer IL5, a spacer SPC, and a light emitting diode LD. The light emitting diode LD may include a first electrode E1, a light emitting layer LEL, and a second electrode E2.

The buffer layer BFR may be disposed or formed on the substrate 100. The buffer layer BFR may effectively prevent diffusion of metal atoms or impurities from the substrate 100 into the active layer ACT.

The active layer ACT may be disposed or formed on the substrate 100. The active layer ACT may be divided into a source region and a drain region doped with impurities and a channel region between the source region and the drain region.

The first insulation layer IL1 may be disposed or formed on the active layer ACT. The first insulation layer IL1 may have an island shape. The first insulation layer IL1 may overlap the active layer ACT and the gate electrode GE and insulate the active layer ACT and the gate electrode GE. However, embodiments are not limited thereto.

In an embodiment, for example, the first insulation layer IL1 may include an inorganic material.

The gate electrode GE may be disposed or formed on the first insulation layer IL1. In an embodiment, the gate electrode GE may overlap the channel region of the active layer ACT.

The second insulation layer IL2 may be disposed or formed on the buffer layer BFR. In addition, the second insulation layer IL2 may cover the active layer ACT, the first insulation layer ILL and the gate electrode GE, and may be formed to have substantially a same (or constant) thickness along the profile of the active layer ACT, the first insulation layer ILL and the gate electrode GE. However, embodiments are not limited thereto.

The source electrode SE and the drain electrode DE may be disposed or formed on the second insulation layer IL2. The source electrode SE may contact the source region of the active layer ACT through a first contact hole defined or formed in the second insulation layer IL2. The drain electrode DE may contact the drain region of the active layer ACT through a second contact hole defined or formed in the second insulation layer IL2.

The third insulation layer IL3 may be disposed or formed on the second insulation layer IL2. In addition, the third insulation layer IL3 may cover the source and drain electrodes SE and DE, and have a substantially flat top surface without defining a step structure around the source and drain electrodes SE and DE. In an embodiment, for example, the third insulation layer IL3 may include or be formed of an organic material.

The connection electrode CP may be disposed or formed on the third insulation layer IL3. The connection electrode CP may contact the source electrode SE or the drain electrode DE through a second contact hole defined or formed in the third insulation layer IL3.

The fourth insulation layer IL4 may be disposed or formed on the third insulation layer IL3. Also, the fourth insulation layer IL4 may cover the connection electrode CP and have a substantially flat top surface without defining a step structure around the connection electrode CP. In an embodiment, for example, the fourth insulation layer IL4 may include or be formed of an organic material.

The first electrode E1 may be disposed or formed on the fourth insulation layer IL4. The first electrode E1 may have reflective or light-transmitting properties. In an embodiment, for example, the first electrode E1 may include or be formed of metal.

The first electrode E1 may contact the connection electrode CP through a third contact hole defined or formed in the fourth insulation layer IL4, such that the first electrode E1 may be connected to the transistor TR.

The fifth insulation layer IL5 may be disposed or formed on the fourth insulation layer IL4. An opening exposing an upper surface of the first electrode E1 may be defined or formed in the fifth insulation layer IL5. In an embodiment, for example, the fifth insulation layer IL5 may include or be formed of an organic material or an inorganic material.

The spacer SPC may be disposed or formed on the fifth insulation layer IL5. In an embodiment, for example, the spacer SPC may include or be formed of an organic material or an inorganic material. The spacer SPC may maintain a gap between the encapsulation layer ECP and the substrate 100.

The spacer SPC may include or be formed of a material different from that of the fifth insulation layer IL5. The spacer SPC may be formed after the fifth insulation layer IL5 is formed. However, embodiments of the disclosure are not limited thereto, and alternatively, the spacer SPC may include a same material as the fifth insulation layer IL5. In an embodiment, for example, the fifth insulation layer IL5 and the spacer SPC may including or be formed of an organic material such as polyimide. In an embodiment, the fifth insulation layer IL5 and the spacer SPC may be simultaneously formed with each other using a halftone mask.

The light emitting layer LEL may be disposed or formed on the first electrode E1. The light emitting layer LEL may be disposed or formed in the opening formed in the fifth insulation layer IL5. In an embodiment, the light emitting layer LEL may have a multilayer structure including a hole injection layer, a hole transport layer, an organic light emitting layer, an electron transport layer, and an electron injection layer. The organic light emitting layer may include or be formed of a light emitting material.

The second electrode E2 may cover the light emitting layer LEL and be disposed or formed on the fifth insulation layer IL5 and the spacer SPC. In an embodiment, the second electrode E2 may have a plate shape. In addition, the second electrode E2 may have light transmitting or reflecting properties. In an embodiment, for example, the second electrode E2 may include or be formed of metal.

The encapsulation layer ECP may prevent penetration of moisture and oxygen into the light emitting diode LD from the outside. In an embodiment, for example, the encapsulation layer ECP may include a first inorganic encapsulation layer IEL1, an organic encapsulation layer OEL, and a second inorganic encapsulation layer IEL2.

The first inorganic encapsulation layer IEL1 may be formed with substantially the constant thickness on the second electrode E2 along the profile of the second electrode E2.

The organic encapsulation layer OEL may be disposed or formed on the first inorganic encapsulation layer IEL1, and have a substantially flat upper surface without defining a step around the first inorganic encapsulation layer IEL1. The second inorganic encapsulation layer IEL2 may be disposed or formed on the organic encapsulation layer OEL.

Figure 5:
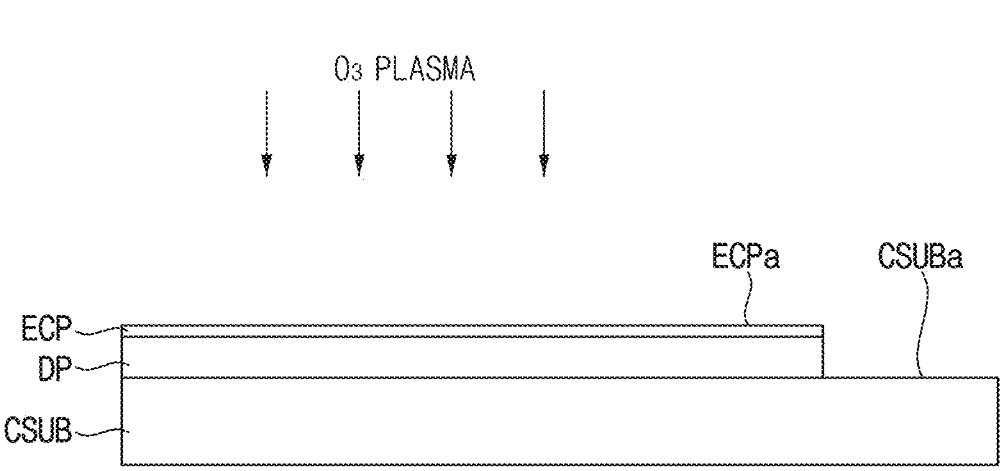
FIG. 5 is a cross-sectional view illustrating a process of a method of manufacturing a display device according to an embodiment of the disclosure.

FIG. 5 is a cross-sectional view illustrating a process of a method of manufacturing a display device according to an embodiment of the disclosure.

Referring further to FIG. 5, in an embodiment, plasma treatment may be performed with ozone $O_3$ on a surface ECPa of the encapsulation layer ECP and a surface CSUBa of the carrier substrate CSUB. However, embodiments of the disclosure are not limited thereto, and alternatively, the plasma treatment may be performed with ozone only on the surface ECPa of the encapsulation layer ECP. In addition, the plasma treatment may be performed only on a position near an edge where an uncured resin layer RSL is formed.

That is, when the plasma treatment is performed on the surface ECPa of the encapsulation layer ECP and the surface CSUBa of the carrier substrate CSUB, ozone may be used as a process gas. Due to the plasma treatment, ozone may be decomposed to oxygen.

When the plasma treatment is performed with ozone on the surface ECPa of the encapsulation layer ECP and the surface CSUBa of the carrier substrate CSUB, the oxygen concentration on the surface ECPa of the encapsulation layer ECP and the surface CSUBa of the carrier substrate CSUB may increase. That is, the oxygen concentration on the surface ECPa of the encapsulation layer ECP and the surface CSUBa of the carrier substrate CSUB may be relatively greater than an oxygen concentration in an atmosphere for the plasma treatment.

The oxygen concentration on the surface ECPa of the encapsulation layer ECP and the surface CSUBa of the carrier substrate CSUB may vary according to an ozone concentration and the number of times of the plasma treatment. In an embodiment, for example, since ozone decomposed by the plasma increases as the ozone concentration increases, the oxygen concentration may increase. Also, as the number of times of the plasma treatment increases, the oxygen concentration on the surface ECPa of the encapsulation layer ECP and the surface CSUBa of the carrier substrate CSUB may increase.

Figure 6:
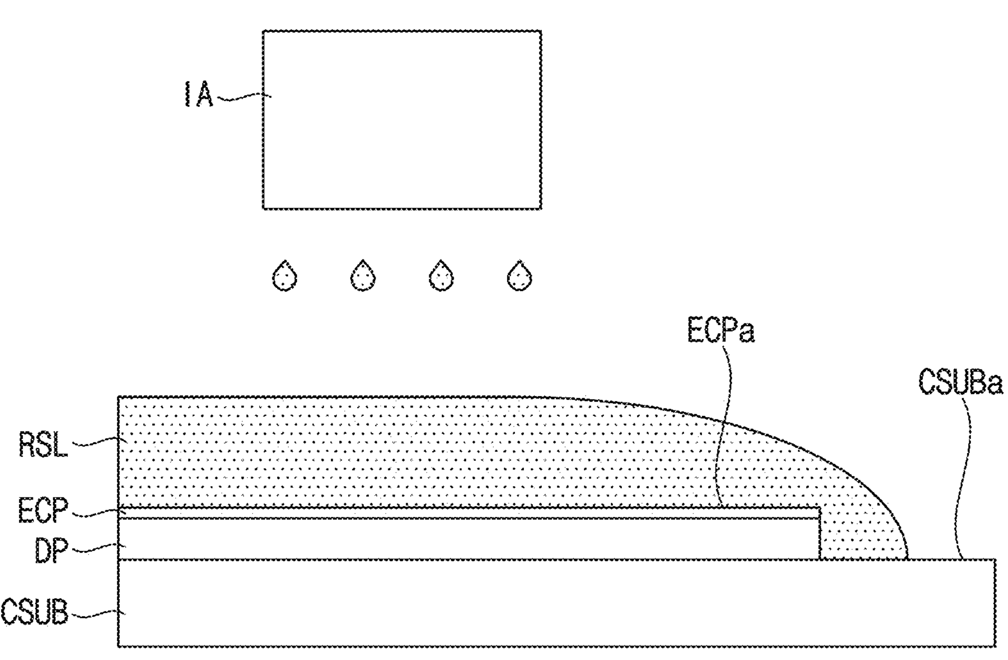
FIG. 6 is a cross-sectional view illustrating a process of a method of manufacturing a display device according to an embodiment of the disclosure.

FIG. 6 is a cross-sectional view illustrating a process of a method of manufacturing a display device according to an embodiment of the disclosure.

Referring further to FIG. 6, in an embodiment, an uncured resin layer RSL may be formed on the encapsulation layer ECP. The uncured resin layer RSL may be formed by an inkjet method. Accordingly, the uncured resin layer RSL may be formed by applying ink on the encapsulation layer ECP by an inkjet apparatus IA. In an embodiment, for example, the inkjet apparatus IA may include an inkjet head that applies the ink. The ink may include a photocurable resin. The photocurable resin may be a material, a hardness of which is increased by being cured by ultraviolet light or the like. The ink may further include an initiator that generates free radicals or ions when stimulated by ultraviolet light or the like.

The uncured resin layer RSL may be formed by printing once or several times with the inkjet apparatus IA. In an embodiment, for example, the uncured resin layer RSL may have a thickness in a range of about 10 micrometers to about 150 micrometers. The uncured resin layer RSL may become thicker as the inkjet apparatus IA prints several times.

The uncured resin layer RSL may cover the encapsulation layer ECP and the display panel DP. That is, the uncured resin layer RSL may protect the encapsulation layer ECP and the display panel DP without exposing the encapsulation layer ECP and the display panel DP. Also, the uncured resin layer RSL may partially overlap the carrier substrate CSUB. However, embodiments of the disclosure are not limited thereto.

Figure 7:
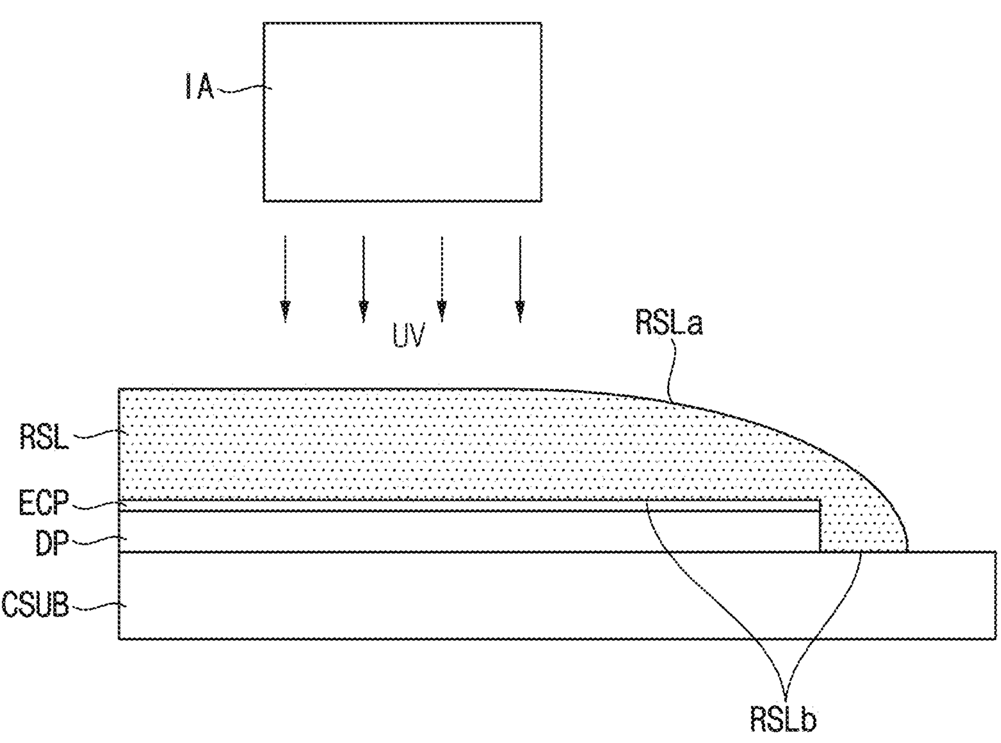
FIG. 7 is a cross-sectional view illustrating a process of a method of manufacturing a display device according to an embodiment of the disclosure.

The uncured resin layer RSL may include a first surface (or a first surface portion) RSLa and a second surface (or a second surface portion) RSLb (shown in FIG. 7). The first surface RSLa may be a surface exposed to an outside. The second surface RSLb may contact the surface ECPa of the encapsulation layer ECP. In addition, as the uncured resin layer RSL partially overlaps the carrier substrate CSUB, the second surface RSLb may also contact the surface CSUBa of the carrier substrate CSUB.

Figure 8:
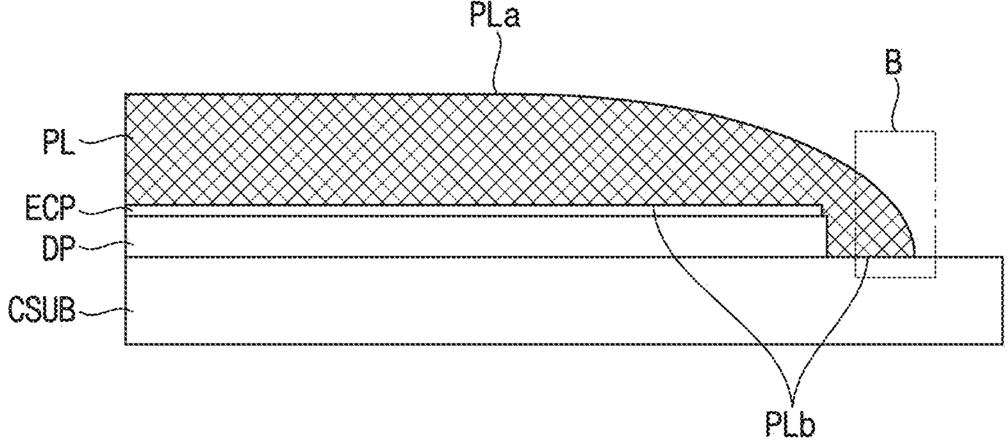
FIG. 8 is a cross-sectional view illustrating a process of a method of manufacturing a display device according to an embodiment of the disclosure.
Figure 9:
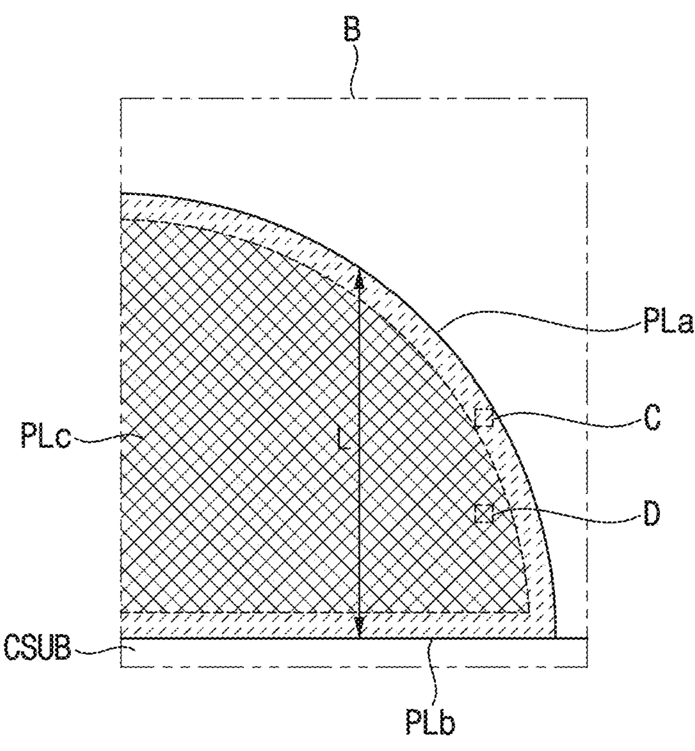
FIG. 9 is an enlarged cross-sectional view of region B of FIG. 8.
Figure 10:
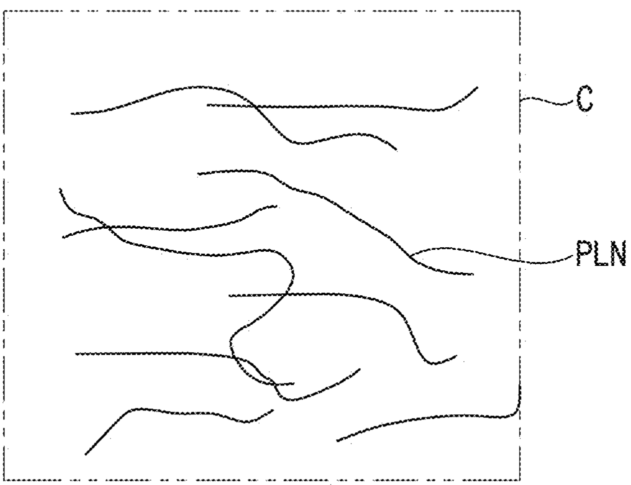
FIG. 10 is an enlarged cross-sectional view of regions C and D of FIG. 9.
Figure 10:
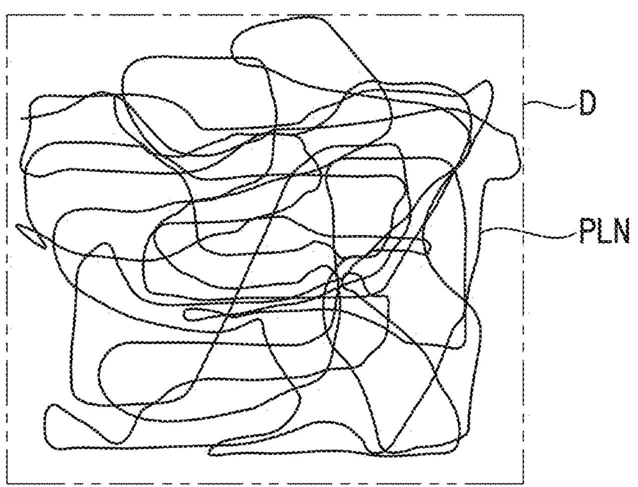

FIG. 7 is a cross-sectional view illustrating a process of a method of manufacturing a display device according to an embodiment of the disclosure. FIG. 8 is a cross-sectional view illustrating a process of a method of manufacturing a display device according to an embodiment of the disclosure. FIG. 9 is an enlarged cross-sectional view of region B of FIG. 8. FIG. 10 is an enlarged cross-sectional view of regions C and D of FIG. 9.

Particularly, FIG. 10 may be a view illustrating polymer networks PLN of each of the first surface PLa and an inside (or an inner portion) PLc of the protective layer PL.

Referring to FIGS. 7 to 10, the inkjet apparatus IA may radiate ultraviolet light to the uncured resin layer RSL. In an embodiment, for example, the inkjet apparatus IA may be a light emitter that emits ultraviolet light. Accordingly, the protective layer PL may be formed by curing the uncured resin layer RSL. That is, the protective layer PL may be in a state in which the uncured resin layer RSL is cured. The protective layer PL may include an organic material.

As the uncured resin layer RSL includes the first surface RSLa and the second surface RSLb, the protective layer PL may also include a first surface PLa and a second surface PLb. In addition, an end of the first surface PLa and an end of the second surface PLb of the protective layer PL may be connected to each other. Accordingly, a length L between the first surface PLa and the second surface PLb may decrease as being toward the end of each of the first surface PLa and the second surface PLb.

When the uncured resin layer RSL is cured, a polymer network PLN may be formed therein. The photocurable resin included in the ink may react with ultraviolet light to form the polymer network PLN. Therefore, the protective layer PL may include the polymer network PLN.

In an embodiment, the uncured resin layer RSL may be cured in a nitrogen atmosphere having an oxygen concentration in a range of about 300 parts per million (ppm) to about 10000 ppm. That is, the curing process may be performed in a nitrogen atmosphere containing oxygen in the range of about 300 ppm to about 10000 ppm.

In such an embodiment, when the uncured resin layer RSL is cured in the nitrogen atmosphere having the oxygen concentration in the range of about 300 ppm to about 10000 ppm, the polymer network PLN formed on the first surface RSLa of the uncured resin layer RSL exposed to the outside may be formed in a state in which bonds are partially disconnected due to oxygen.

For example, when the UV light is radiated onto the uncured resin layer RSL, radicals may be formed due to the initiator. The radicals may form the polymer network PLN while decomposing existing bonds. However, when oxygen is present at this process, the radicals may react with oxygen. In addition, as the radicals react with oxygen, existing bonds inside the uncured resin layer RSL may be decomposed and bonded with oxygen, and as a result, a rate of formation of the polymer network PLN may decrease. Therefore, as the oxygen concentration increases, the density of the polymer network PLN may decrease.

In such an embodiment, since oxygen may not penetrate into the uncured resin layer RSL, the polymer network PLN may be formed inside the uncured resin layer RSL without any reaction between the radicals oxygen. Accordingly, the polymer network PLN formed inside the uncured resin layer RSL may form a relatively long bond.

In an embodiment, the density of the polymer network PLN of the first surface PLa of the protective layer PL may be different from the density of the polymer network PLc of inside of the protective layer PL due to the oxygen concentration. That is, the density of the polymer network PLN of the first surface PLa of the protective layer PL may vary according to the oxygen concentration. In an embodiment, for example, as the oxygen concentration increases, the density of the polymer network PLN of the first surface PLa of the protective layer PL may decrease.

In an embodiment, for example, the density of the polymer network PLN of the first surface PLa of the protective layer PL may be less than the density of the polymer network PLN of the inside PLc of the protective layer PL. That is, the density of the polymer network PLN of the protective layer PL may increase as being away from the first surface PLa of the protective layer PL toward the inside PLc of the protective layer PL.

Also, the first surface PLa of the protective layer PL may have a hardness less than the inside PLc of the protective layer PL.

Before the uncured resin layer RSL is formed, as the plasma treatment is performed with ozone, the oxygen concentration on the surface ECPa of the encapsulation layer ECP and the surface CSUBa of the carrier substrate CSUB may increase. Therefore, like the first surface RSLa of the uncured resin layer RSL, the polymer network PLN formed on the second surface RSLb of the uncured resin layer RSL may be formed in a state in which the bonding is partially broken due to oxygen present on the surface ECPa of the encapsulation layer ECP and the surface CSUBa of the carrier substrate CSUB. When curing is performed in an atmosphere with a relatively high oxygen concentration, oxygen may be bonded between carbon bonds to partially break bonds of the polymer network PLN.

In an embodiment, the density of the polymer network PLN of the second surface PLb of the protective layer PL may be different from the density of the polymer network PLN of inside PLc of the protective layer PL due to the oxygen concentration. That is, the density of the polymer network PLN of the second surface PLb of the protective layer PL may vary according to the oxygen concentration. In an embodiment, for example, as the oxygen concentration increases, the density of the polymer network PLN of the second surface PLb of the protective layer PL may decrease.

In an embodiment, for example, the density of the polymer network PLN of the second surface PLb of the protective layer PL may be less than the density of the polymer network PLN of the inside PLc of the protective layer PL. That is, the density of the polymer network PLN of the protective layer PL may increase as being away from the second surface PLb of the protective layer PL toward the inside PLc of the protective layer PL.

Also, the second surface PLb of the protective layer PL may have a hardness less than the inside PLc of the protective layer PL.

A portion of the protective layer PL affected by the oxygen concentration may have a thickness of about 10 micrometers from the first surface PLa toward the inside PLc of the protective layer PL. Similarly, a portion of the protective layer PL affected by the oxygen concentration on the surface ECPa of the encapsulation layer ECP and the surface CSUBa of the carrier substrate CSUB may have a thickness of about 10 micrometers from the second surface PLb toward the inside PLc. However, the disclosure is not limited thereto.

Figure 11:
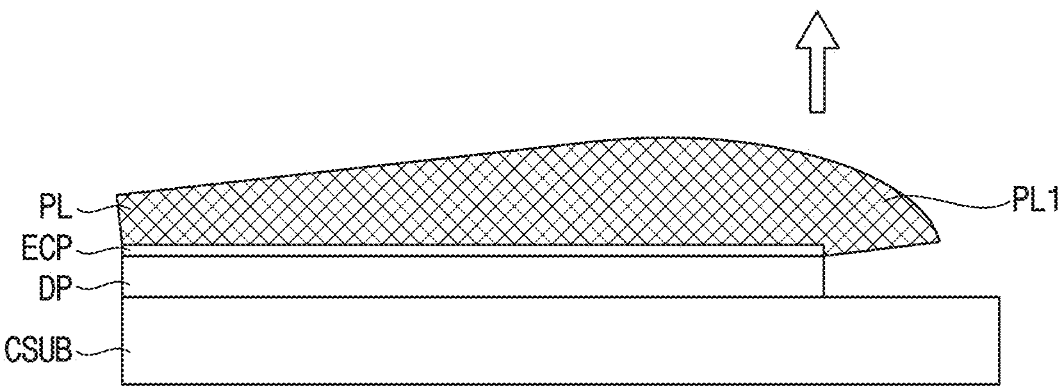
FIG. 11 is a cross-sectional view illustrating a process of a method of manufacturing a display device according to an embodiment of the disclosure.
Figure 12:
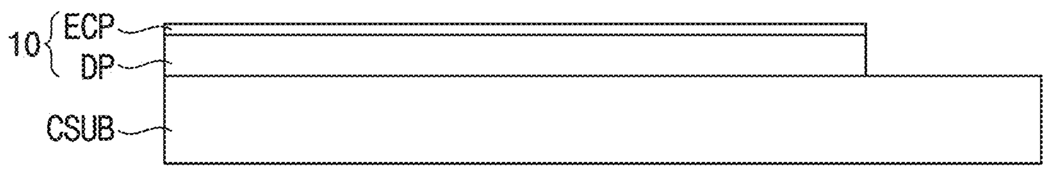
FIG. 12 is a cross-sectional view illustrating a process of a method of manufacturing a display device according to the disclosure.

FIG. 11 is a cross-sectional view illustrating a process of a method of manufacturing a display device according to an embodiment of the disclosure, and FIG. 12 is a cross-sectional view illustrating a process of a method of manufacturing a display device according to an embodiment of the disclosure.

Further referring to FIGS. 11 and 12, the protective layer PL may be peeled from the encapsulation layer ECP and the display panel DP. That is, the protective layer PL may be removed from the encapsulation layer ECP and the display panel DP. The protective layer PL may be a layer that protects the encapsulation layer ECP and the display panel DP in a manufacturing process. Therefore, the protective layer PL may be peeled from the encapsulation layer ECP and the display panel DP after the manufacturing process is finished. Through this, the display device 10 including the encapsulation layer ECP and the display panel DP may be formed.

In an embodiment, the protective layer PL may be peeled off by lifting an end PL1 of the protective layer PL. The end PL1 of the protective layer PL is a place where the first surface PLa and the second surface PLb of the protective layer PL are connected to each other, and the hardness may be low and the density of the polymer network PLN may be low in the end PL1 of the protective layer PL. Accordingly, the protective layer PL may be easily peeled off by lifting the end PL1 of the protective layer PL.

The peel strength of the protective layer PL may be determined based on (or controlled by controlling) the oxygen concentration in the atmosphere for the plasma treatment. The peel strength may represent the degree of force applied when a member is peeled from another member. For example, when the oxygen concentration is high, the peel strength of the protective layer PL may be reduced. In contrast, when the oxygen concentration is low, the peel strength of the protective layer PL may increase.

In an embodiment, a peel strength of the protective layer PL may be in a range of about 1 gram-force per inch (g·f/inch) to about 80 g·f/inch. If the peel strength of the protective layer PL is less than about 1 g. f/inch, the protective layer PL may self-peel during the manufacturing process. Therefore, the display panel DP and the encapsulation layer ECP cannot be protected, and the display panel DP and the encapsulation layer ECP may be damaged. If the peel strength of the protective layer PL is greater than about 80 g·f/inch, an adhesive force of the protective layer PL may increase. Therefore, when removing the protective layer PL after the manufacturing process, the protective layer PL may not be easily peeled from the display panel DP and the encapsulation layer ECP.

In an embodiment, as the oxygen concentration increases, the density of the polymer network PLN may decrease. Also, as the oxygen concentration increases, the peel strength of the protective layer PL may decrease.

In an embodiment, the curing process may be performed in a nitrogen atmosphere having the oxygen concentration in the range of about 300 ppm to about 10000 ppm.

If the oxygen concentration is less than about 300 ppm, the density of the polymer network PLN may increase. Accordingly, the peel strength of the protective layer PL may increase. Therefore, when the protective layer PL is peeled off, it may not be easy to peel the protective layer PL from the display panel DP and the encapsulation layer ECP.

If the oxygen concentration is greater than about 10000 ppm, the density of the polymer network PLN may decrease. That is, when the uncured resin layer RSL is cured, the polymer network PLN may not be properly formed. Therefore, the hardness of the protective layer PL may decrease, and the peel strength of the protective layer PL may decrease. As a result, the protective layer PL may self-peel before the manufacturing process is finished, and the encapsulation layer ECP and the display panel DP may be damaged.

In an embodiment, the density of the polymer network PLN of the protective layer PL is controlled through the oxygen concentration in the atmosphere for the plasma treatment, so that the peel strength of the protective layer PL may be controlled during the manufacturing process of the display device 10. In addition, the peel strength of the protective layer PL may be adjusted by controlling the oxygen concentration in the atmosphere for the plasma treatment based on the material of the member with which the protective layer PL contacts. Therefore, in an embodiment where the protective layer PL is formed by the inkjet method, the protective layer PL may be easily peeled from the display panel DP and the encapsulation layer ECP, so that the manufacturing efficiency of the display device may be increased.

In addition, since the end of the first surface PLa and the end of the second surface PLb of the protective layer PL are connected to each other, the protective layer PL may be easily peeled off. That is, by lifting the end PL1 of the protective layer PL, which has a relatively small peel strength, the protective layer PL may be easily peeled off.

Figure 13:
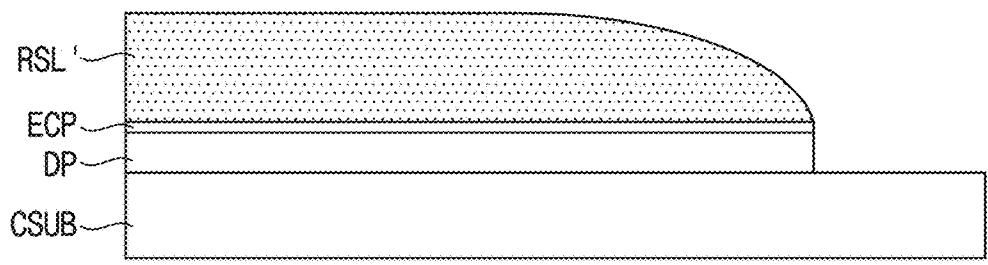
FIG. 13 is a cross-sectional view illustrating alternative embodiment of the process shown in FIG. 6.

FIG. 13 is a cross-sectional view illustrating an alternative embodiment of the process shown in FIG. 6.

Referring to FIG. 13, in an alternative embodiment, an uncured resin layer RSL' may be formed only on the encapsulation layer ECP. That is, the uncured resin layer RSL' may not be formed on the carrier substrate CSUB, but may be formed spaced apart from the carrier substrate CSUB. However, embodiments of the disclosure are not limited thereto.

In such an embodiment, plasma treatment with ozone may be performed only on a surface of the encapsulation layer ECP. Accordingly, the protective layer PL may be peeled off by lifting an end of the uncured resin layer RSL' formed on the surface of the encapsulation layer ECP.

Figure 14:
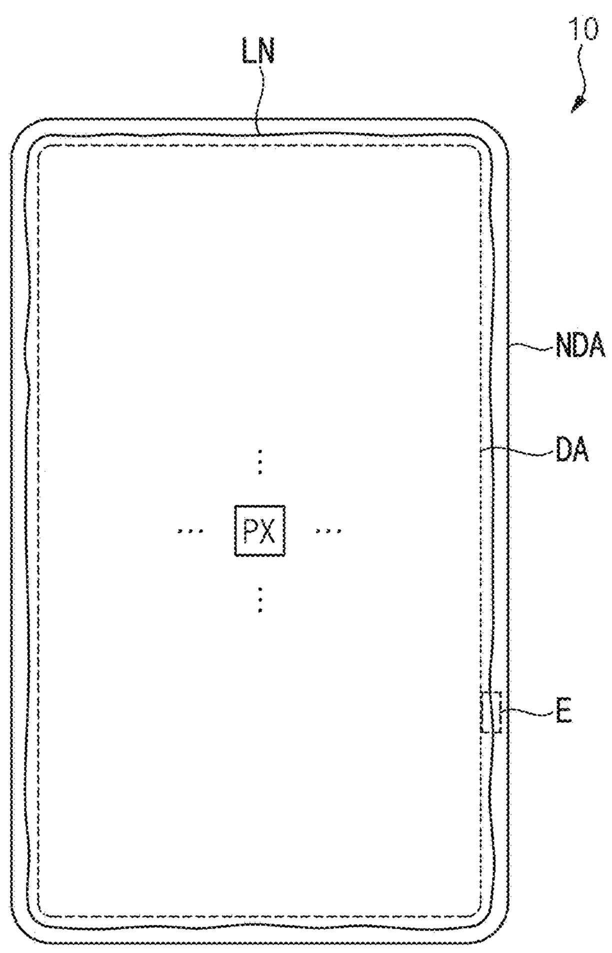
FIG. 14 is a plan view illustrating a display device according to an embodiment of the disclosure.
Figure 15:
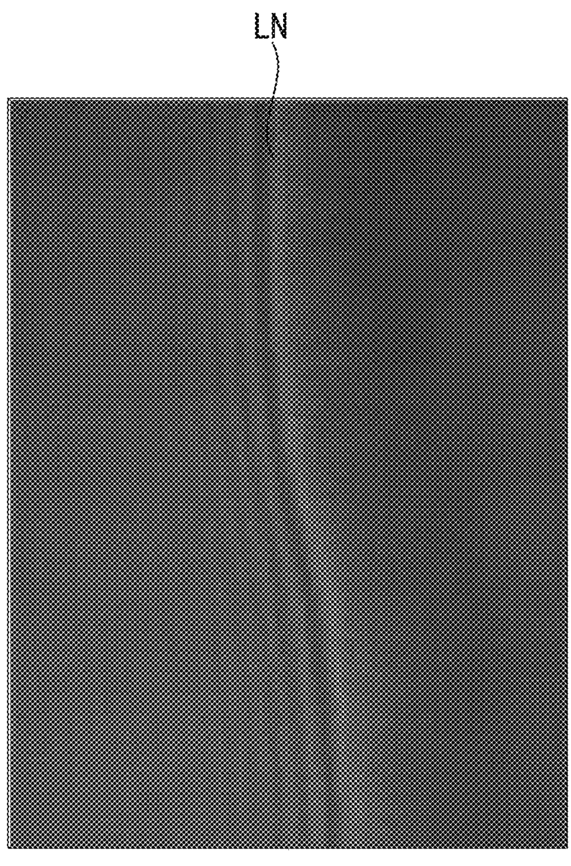
FIG. 15 is an enlarged plan view of region E of FIG. 14.

FIG. 14 is a plan view illustrating a display device according to an embodiment of the disclosure. FIG. 15 is an enlarged plan view of region E of FIG. 14.

An embodiment of a display device 10 of FIG. 14 may be a display device manufactured by the method of manufacturing the display device described above with reference to FIGS. 1 to 12. Also, the display device 10 of FIG. 14 may have a planar shape as in the display device 10 of FIG. 2. Therefore, any repetitive detailed descriptions of the same or like elements of the display device 10 of FIG. 14 as those described above may be omitted.

Referring to FIGS. 2, 14, and 15, an embodiment of a display device 10 may include an encapsulation layer (e.g., the encapsulation layer ECP of FIG. 3) and a display panel (e.g., the display panel DP of FIG. 3).

When a protective layer (for example, the protective layer PL of FIG. 11) is peeled off from the display device 10, a stain line LN may be formed at a location where the protective layer was formed due to a coffee ring phenomenon. In an embodiment, where the protective layer is formed by the inkjet method, the coffee ring phenomenon may occur when the ink is discharged onto the display device 10 and then dried.

Specifically, in general, liquid may be dried from an edge. The liquid located inside may flow to the edge by capillary flow. In addition, the liquid may maintain its spherical shape by surface tension. If the edge of the liquid evaporates first, the existing shape may be maintained while the liquid inside flows to the edge.

For example, when the liquid having a predetermined color is discharged to a specific object, solute that have migrated inside the liquid may accumulate at the edge. And, as the liquid continues to evaporate, the solute may continue to accumulate at the edge. Therefore, when all of the discharged liquid is dried, the edge may have a darker color than a central portion.

Therefore, during the manufacturing process, the stain line LN may be visually recognized near the edge of the protective layer at the position where the protective layer is formed.

In an embodiment, for example, the stain line LN may be formed in the non-display area NDA. Accordingly, the stain line LN may not be viewed in the display area DA. However, embodiments of the disclosure are not limited thereto, and the stain line LN may be formed in the display area DA.

In an embodiment, in the process of peeling the protective layer, the material of the protective layer may remain on the display device 10. That is, since the protective layer includes an organic material, the organic material may be partially detected because a portion of the protective layer remains on the display device 10.

The methods according to the embodiments may be applied to a display device included in a computer, a notebook, a mobile phone, a smartphone, a smart pad, a personal media player (PMP), a personal digital assistant (PDA), an MP3 player, or the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display device, the method comprising:

providing an encapsulation layer on a display panel;

providing an uncured resin layer on a surface of the encapsulation layer; and forming a protective layer by curing the uncured resin layer in a nitrogen atmosphere having an oxygen concentration in a range of about 300 ppm to about 10000 ppm, wherein the protective layer includes a polymer network, the protective layer includes a first surface exposed to an outside and a second surface contacting the surface of the encapsulation layer, and a density of the polymer network in the second surface of the protective layer is different from a density of the polymer network in an inner portion of the protective layer.

2. The method of claim 1, wherein the polymer network is formed when the uncured resin layer is cured.

3. The method of claim 1, further comprising:

before the providing the uncured resin layer, performing a plasma treatment with ozone on the surface of the encapsulation layer.

4. The method of claim 3, wherein an oxygen concentration on the surface of the encapsulation layer increases through the performing the plasma treatment with ozone.

5. The method of claim 3, wherein an end of the first surface and an end of the second surface are connected to each other.

6. The method of claim 5, wherein a length between the first surface and the second surface decreases as being toward the end of the first surface and the end of the second surface connected to each other.

7. The method of claim 5, wherein a density of the polymer network in the first surface of the protective layer is different from the density of the polymer network in the inner portion of the protective layer.

8. The method of claim 7, wherein the density of the polymer network of the first surface of the protective layer is less than the density of the polymer network in the inner portion of the protective layer.

9. The method of claim 1, wherein a density of the polymer network of the protective layer increases as being away from the first surface of the protective layer toward the inner portion of the protective layer.

10. The method of claim 1, wherein the density of the polymer network of the second surface of the protective layer is less than the density of the polymer network in the inner portion of the protective layer.

11. The method of claim 1, wherein the density of the polymer network of the protective layer increases as being away from the second surface of the protective layer toward the inner portion of the protective layer.

12. The method of claim 1, wherein the first surface of the protective layer has a hardness less than a hardness of the inner portion of the protective layer.

13. The method of claim 1, wherein the second surface of the protective layer has a hardness less than a hardness of the inner portion of the protective layer.

14. The method of claim 1, wherein the providing the uncured resin layer comprises using an inkjet method.

15. The method of claim 1, wherein the forming the protective layer comprises irradiating the uncured resin layer with ultraviolet light.

16. The method of claim 1, further comprising:

peeling the protective layer from the encapsulation layer and the display panel.

17. The method of claim 16, wherein the protective layer has a peel strength in a range of about 1 g·f/inch to about 80 g·f/inch.

18. The method of claim 17, wherein the peel strength of the protective layer is controlled by controlling the oxygen concentration of the nitrogen atmosphere.

* * * * *